United States Patent

Backer et al.

[11] Patent Number: 5,878,941
[45] Date of Patent: Mar. 9, 1999

[54] METHOD OF SOLDERING COMPONENTS ON A CARRIER FOIL

[75] Inventors: Heiko Backer; Reinhard Wendt, both of Hamburg, Germany

[73] Assignee: U.S. Philips Corporation, New York, N.Y.

[21] Appl. No.: 684,870

[22] Filed: Jul. 25, 1996

[30] Foreign Application Priority Data

Jul. 27, 1995 [DE] Germany ............... 195 27 398.2

[51] Int. Cl.⁶ .......................... B23K 1/012; B23K 31/02
[52] U.S. Cl. .................... 228/180.21; 228/234.1
[58] Field of Search ............. 228/180.21, 234.1, 228/219

[56] References Cited

U.S. PATENT DOCUMENTS

| | | | |
|---|---|---|---|
| 3,717,742 | 2/1973 | Fottler | 228/180.21 |
| 3,887,997 | 6/1975 | Hartleroad et al. | 228/180.21 |
| 3,887,998 | 6/1975 | Hartleroad et al. | 228/180.21 |
| 4,789,096 | 12/1988 | Dunn et al. | 228/180.21 |
| 5,163,599 | 11/1992 | Mishina et al. | 228/42 |

FOREIGN PATENT DOCUMENTS

| | | |
|---|---|---|
| 0279604A2 | 8/1988 | European Pat. Off. |
| 461961A1 | 12/1991 | European Pat. Off. |
| 2073856 | 10/1971 | France |

*Primary Examiner*—Patrick Ryan
*Assistant Examiner*—Jeffrey T. Knapp
*Attorney, Agent, or Firm*—Steven R. Biren

[57] ABSTRACT

The invention relates to a method of soldering components on a carrier foil whereby hot gas is conducted onto the lower side of the carrier foil. Special soldering methods are necessary especially in SMD technology, whereby components can be soldered in large numbers on a carrier foil in a non-destructive manner both for the component itself and for the carrier foil. According to the invention, the hot gas is aimed at a soldering spot through a nozzle, heating this spot until solder heated by the hot gas flow melts on the surface of the carrier foil.

6 Claims, 1 Drawing Sheet

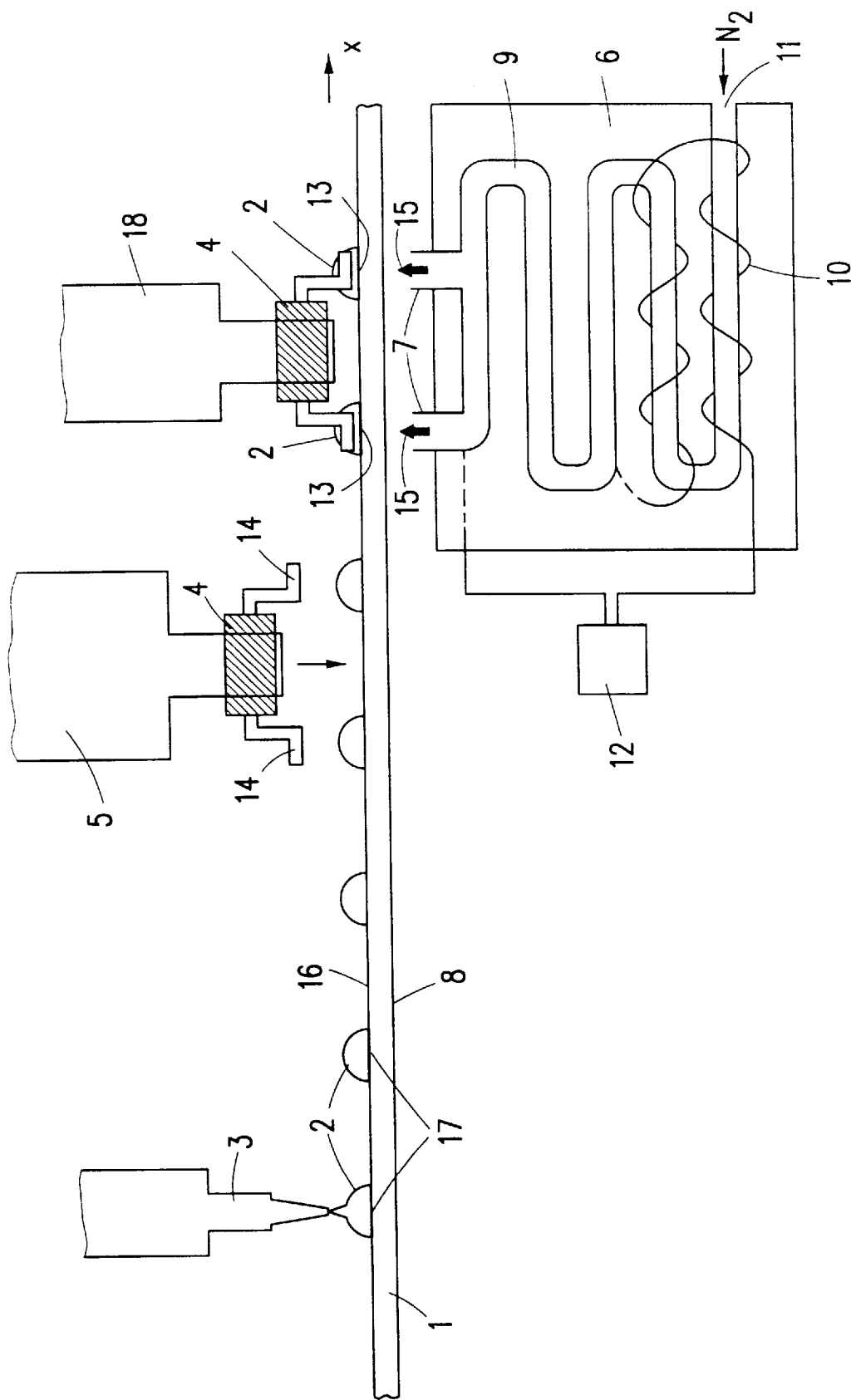

.

METHOD OF SOLDERING COMPONENTS ON A CARRIER FOIL

BACKGROUND OF THE INVENTION

1. Field of the Invention

The invention relates to a method of soldering components on a carrier foil, by which method hot gas is conducted onto the lower side of the carrier foil. The invention also relates to a device for carrying out this method.

One of the main requirements imposed on circuit technology is that increasingly large numbers of functions are to be accommodated in ever smaller spaces. Various techniques are used for this. In the SMD technique (Surface Mounted Devices), discrete components of very small dimensions are soldered on the surface of a board or carrier foil. In a so-called hybrid technique, for example, integrated semiconductor circuits and discrete (SMD) components are provided on a joint carrier. Special soldering processes are necessary to achieve that the component to be soldered itself or a semiconductor crystal present adjacent the soldering spot are not damaged by the heat during the soldering process.

2. Description of the Prior Art

A device for soldering components on a carrier is known from EP-A 461 961. The supporting boards are transported through an oven by means of a transport apparatus. Several blower units are arranged in the oven in pairs above or below the transport apparatus. These blower units blow hot gas through a porous plate onto the supporting board, so that the supporting board itself and a soldering paste provided thereon are heated. The heating zone is followed by a cooling zone in which cold gas is blown against the supporting board, so that the solder solidifies.

Since hot gas flows against the supporting board in this method from above and from below, uniformly heating the entire portion of the board present in the gas flow, heat-sensitive components already present on the supporting board may become damaged. A further problem is that the soldering paste may flow away from the soldering spot during heating in the case of a hot gas flow from above.

SUMMARY OF THE INVENTION

The invention accordingly has for its object to provide an improved soldering method and a device for carrying out this soldering method.

As for the method, this object is achieved in that the hot gas is aimed as a hot gas jet at a soldering spot by means of a nozzle and heats said spot until solder present on the upper side of the carrier foil and heated by the hot gas jet melts. Since the hot gas jet is aimed directly at a soldering spot, only the solder present exactly in this soldering spot is heated and melted. The heat in this case penetrates through the carrier foil without damaging the foil itself, the component to be soldered, or adjoining components. The hot gas jet is switched off the moment the solder has melted, whereupon the solder solidifies very quickly. This switching-on and -off of the hot gas jet renders possible a very accurate time control of the soldering process without overheating taking place.

In an embodiment of the method according to the invention, the gas is heated in that it is passed through a heated metal block. This represents a very simple technical process possibility for heating the gas to a desired temperature.

In a preferred further embodiment of the method according to the invention, a viscous soldering paste is first provided on the carrier foil, a connection point of the component to be soldered is introduced into the soldering paste, and the soldering process takes place subsequently. The viscosity of the soldering paste achieves that the component to be soldered does not shift while the carrier foil is being moved into the correct position above the nozzle. It is not necessary in this case to provide an adhesive at the lower side of the connection points of the component to be soldered for fastening the component to the carrier foil before the soldering process.

A particularly advantageous embodiment of the method according to the invention is one in which an inert gas, in particular nitrogen, or compressed air is used as the gas. A gas suitable for use is also a gas mixture known under the trade name "Menggas" (forming gas), comprising nitrogen with approximately 2–3% hydrogen added. The object of this is to prevent oxidation at the soldering spots and inside a heated metal block through which the gas flows. Particles entering the gas flow owing to oxidation would, for example, pollute a semiconductor crystal circuit present on the carrier foil and not yet protected by a covering material, thus leading to malfunctions. The hot gas flow should accordingly be as free from particles as possible.

A device for carrying out the method according to the invention is characterized in that a nozzle is arranged below the carrier foil and aimed at the soldering spot, through which nozzle the switchable hot gas flow is conducted towards the soldering spot.

In an embodiment of this arrangement according to the invention, the nozzle is provided at a heated metal block through which the gas is passed so as to be heated. To avoid that oxidation occurs in the metal block during heating of the gas, whereby particles could enter the gas flow, the metal block is preferably made from scale-free steel. This has the additional advantage that the heated metal block is not subject to warping, i.e. the metal block shows only very little deformation during heating and cooling-down or during operation as a result of thermal expansion. It is safeguarded thereby that the direction of flow of the hot gas jet through the nozzle does not change, since also the position of the nozzle does not change.

In a further embodiment of the invention, the metal block comprises a meandering passage in its interior through which the gas is guided to the nozzle. The passage is given a maximum length in this manner so that the gas is heated as thoroughly as possible on its way through the metal block.

To avoid cold-soldered spots, an advantageous further embodiment is so arranged that the component is held in position by a retaining device during the soldering process until the solder has solidified.

Further embodiments of the invention will become apparent from the dependent claims.

BRIEF DESCRIPTION OF THE DRAWING

The invention will now be explained in more detail below with reference to the sole FIGURE, which shows a device for carrying out the soldering method according to the invention in which the individual process steps are distinguishable.

DETAILED DESCRIPTION OF THE PREFERRED EMBODIMENTS

Reference numeral 1 denotes a thin flexible carrier foil on whose upper side 16 several components, for example a coil 4, are to be soldered. Connection lines and other components, such as, for example, a highly integrated circuit on a silicon crystal, which may already be present on the upper side 16 of the carrier foil 1 before the method according to the invention is carried out, are not shown in the FIGURE.

As is shown in the left-hand part of the FIGURE, the solder is first provided to the upper side 16 of the carrier foil 1 from a solder dispenser 3 in the soldering spots 17 where the coil 4 is to be soldered to the carrier foil 1. The solder used is preferably a high-viscosity soldering paste which forms a hemispherical solder droplet 2 at each of the contact spots 17.

In the next process step (central part of the FIGURE), the coil 4 is introduced with its connection points 14 into the solder droplets 2 by means of a positioning device 5. Because of its viscosity, the soldering paste will surround the connection points 14 of the coil 4, as shown in the right-hand part of the FIGURE. The soldering process proper then follows.

A metal block 6 made of scale-free steel is present below the carrier foil 1 and has a meandering passage 9 in its interior. This passage 9 issues in a direction towards the lower side 8 of the carrier foil 1 into two nozzles 7 projecting from the metal block 6. These nozzles 7 are mutually so arranged that they lie directly opposite the soldering spots 13.

The metal block 6 is heated by heater coils 10 coiled around the passage 9 in the interior of the metal block 6. These heater coils 10 are supplied by an electric supply unit 12 which is symbolically shown only. Said heater coils 10 are shown in the lower part of the metal block 6 only in the FIGURE, but they should be deemed to continue in the same manner through the remaining part of the metal block 6.

To start the soldering process, nitrogen ($N_2$) is introduced into the passage 9 with an adjustable flowrate from the inlet opening 11 of the passage 9. While the gas is flowing through the passage 9 towards the nozzles 7, it is heated by the high temperature of the metal block 6. The hot gas jet 15 emerges from the nozzles 7 and is aimed directly at the soldering spots 13. As a result, the solder melts in the soldering spots 13. The directional effect of the nozzles 7 has the result that only the solder droplets 2, but not the coil 4 or other components or lines present adjacent the soldering spot 13 are heated.

The moment the nitrogen supply, and thus the hot gas flow 15, is switched off, the solder 2 will solidify very quickly. When the solder 2 has solidified fully, the coil 4 is mechanically fixed and is connected with electrical conduction to, for example, a conductor track on the upper side 16 of the carrier foil 1.

During this soldering process, the component 4 to be soldered is held immovably in position by a further retaining device 18, in particular during the solidifying process of the solder 2. This prevents the formation of a cold weld.

The passage 9 through the metal block 6 is made as long as possible for a maximum heating of the gas in the range from the inlet opening 11 to the nozzles 7. This is achieved in that the passage 9 traverses the entire metal block 6 in meandering curves. In a practical embodiment, the hot gas flow 15 has a temperature of 280° C. at the nozzles with a temperature of the metal block of 400° C.

The metal block 6 may also comprise several passages 9 and more than one or two nozzles 7 at the end of each passage. This renders it possible to solder several components simultaneously on one or on several carrier foils 1. The nozzles 7 are so arranged that the hot gas jets 15 are directly aimed at the relevant soldering spots 13.

In a practical realization, the three process steps shown (solder paste feed, positioning of component, soldering process proper) are carried out by devices positioned one after the other. The carrier foil is then moved step by step along the individual devices in the direction indicated with arrow x by means of a positioning unit. Owing to the viscosity of the soldering paste, the component 4 remains on the carrier foil 1 without shifting during indexing into the next position after it has been placed on the carrier foil 1 by the positioning device 5. An adhesive often used at the lower side of the connection points 14 can thus be omitted.

The method according to the invention is used, for example, in the manufacture of a transponder circuit in which signals are transmitted to a receiver in a contactless manner. This circuit comprises besides semiconductor circuits on the carrier foil also a coil which is constructed as a discrete component. The coil is soldered on the carrier foil by the method according to the invention as the final component in this case, after which the entire circuit assembly is impregnated.

The method according to the invention offers a simple, inexpensive, and fast possibility for soldering discrete components on flexible carrier foils. Damage to components to be soldered or adjacent components is prevented in that the heat for melting the solder is aimed accurately at the soldering spots only. In addition, this method can be carried out by a machine and without mechanical contact. Automatic soldering of large numbers of components on a flexible carrier foil is rendered possible thereby.

What is claimed is:

1. A method of soldering components (4) directly on an upper side (16) of a substantially continuous carrier foil (1), comprising conducting hot gas directly onto only a lower side (8) of the carrier foil (1) by aiming the hot gas as a hot gas jet (15) at a soldering spot (13) by means of a nozzle and thereby heating said spot until solder (2) on the upper side (16) of the carrier foil (1) melts.

2. A method as claimed in claim 1, characterized in that an inert gas or compressed air is used as the gas.

3. A method as claimed in claim 1, characterized in that the gas is heated in that it is passed through a heated metal block (6).

4. A method as claimed in claim 3, characterized in that an inert gas or compressed air is used as the gas.

5. A method as claimed in claim 1, characterized in that a viscous soldering paste (2) is first provided on the carrier foil (1), a connection point (14) of the component (4) to be soldered is introduced into the soldering paste (2), and the soldering process takes place subsequently.

6. A method as claimed in claim 5, characterized in that an inert gas or compressed air is used as the gas.

\* \* \* \* \*